(12) United States Patent  
Yoshita et al.

(10) Patent No.: US 12,117,538 B2
(45) Date of Patent: Oct. 15, 2024

(54) SOLID-STATE IMAGING DEVICE AND ELECTRONIC APPARATUS

(71) Applicant: Sony Semiconductor Solutions Corporation, Kanagawa (JP)

(72) Inventors: Ryoto Yoshita, Kanagawa (JP); Takafumi Takatsuka, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 534 days.

(21) Appl. No.: 17/274,519

(22) PCT Filed: Sep. 9, 2019

(86) PCT No.: PCT/JP2019/035332
§ 371 (c)(1),
(2) Date: Mar. 9, 2021

(87) PCT Pub. No.: WO2020/059553
PCT Pub. Date: Mar. 26, 2020

(65) Prior Publication Data
US 2022/0052088 A1    Feb. 17, 2022

(30) Foreign Application Priority Data

Sep. 20, 2018  (JP) ................................. 2018-175983

(51) Int. Cl.
*G01S 19/30* (2010.01)
*G01S 19/37* (2010.01)
*H01L 27/146* (2006.01)

(52) U.S. Cl.
CPC .............. *G01S 19/30* (2013.01); *G01S 19/37* (2013.01); *H01L 27/1461* (2013.01);
(Continued)

(58) Field of Classification Search
CPC ...... G01S 19/30; G01S 19/37; H01L 27/1461; H01L 27/14614; H01L 27/1464;
(Continued)

(56) References Cited

U.S. PATENT DOCUMENTS 10,560,649 B2 * 2/2020 Geurts .............. H01L 27/14645
2011/0019038 A1   1/2011 Okuno
(Continued)

FOREIGN PATENT DOCUMENTS

CN   102170533 A   8/2011
CN   103959467 A   7/2014
(Continued)

OTHER PUBLICATIONS

Translation of JP 2012-175259 (Year: 2012).*

*Primary Examiner* — Benjamin P Sandvik
*Assistant Examiner* — John Patrick Cornely
(74) *Attorney, Agent, or Firm* — Michael Best & Friedrich LLP

(57) ABSTRACT

A solid-state imaging device according to an embodiment of the present disclosure includes a light receiving surface, and two or more pixels opposed to the light receiving surface. Each of the pixels includes a photoelectric conversion section that performs photoelectric conversion on light entering via the light receiving surface, a first charge holding section that holds a charge transferred from the photoelectric conversion section, and a second charge holding section disposed at a position where all or a portion thereof overlaps the first charge holding section in a planar layout, and formed to have no electrical continuity to the first charge holding section. Each of the pixels further includes a first transfer transistor that transfers the charge held by the first charge holding section to a floating diffusion, and a second (Continued)

transfer transistor that transfers a charge held by the second charge holding section to the floating diffusion.

12 Claims, 10 Drawing Sheets

(52) U.S. Cl.
CPC .... *H01L 27/14614* (2013.01); *H01L 27/1464* (2013.01); *H01L 27/14643* (2013.01)

(58) Field of Classification Search
CPC ......... H01L 27/14643; H01L 27/14612; H01L 27/1463; H04N 25/77
See application file for complete search history.

(56) References Cited

U.S. PATENT DOCUMENTS

| | | |
|---|---|---|
| 2011/0079832 A1 | 4/2011 | Masagaki et al. |
| 2011/0221940 A1 | 9/2011 | Kato |
| 2014/0084143 A1 | 3/2014 | Sakano et al. |
| 2015/0076323 A1 | 3/2015 | Mabuchi |
| 2015/0228693 A1* | 8/2015 | Toda ................. H01L 27/14818 257/229 |
| 2016/0155774 A1 | 6/2016 | Hasegawa et al. |
| 2016/0254305 A1 | 9/2016 | Sakano et al. |

FOREIGN PATENT DOCUMENTS

| | | |
|---|---|---|
| CN | 104662661 A | 5/2015 |
| JP | 2011-029835 A | 2/2011 |
| JP | 2011-082330 A | 4/2011 |
| JP | 2012-175259 A | 9/2012 |
| JP | 2013-033885 A | 2/2013 |
| JP | 2013150232 A | 8/2013 |
| JP | 2016-063142 A | 4/2016 |
| JP | 2016-103541 A | 6/2016 |

\* cited by examiner

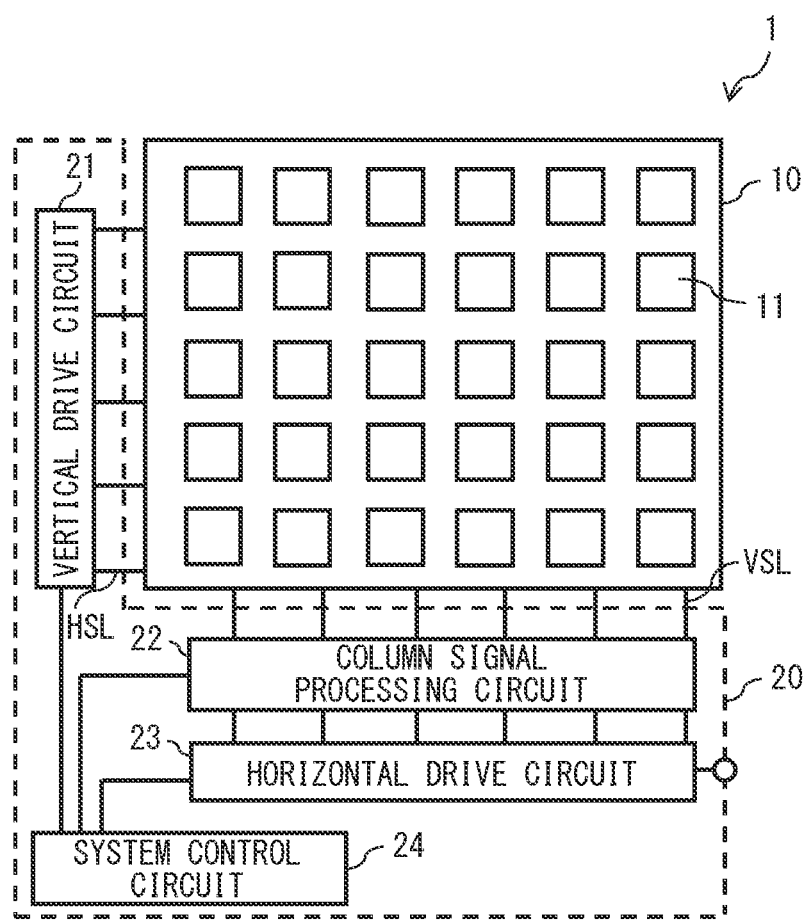
[FIG. 1]

[FIG. 2]
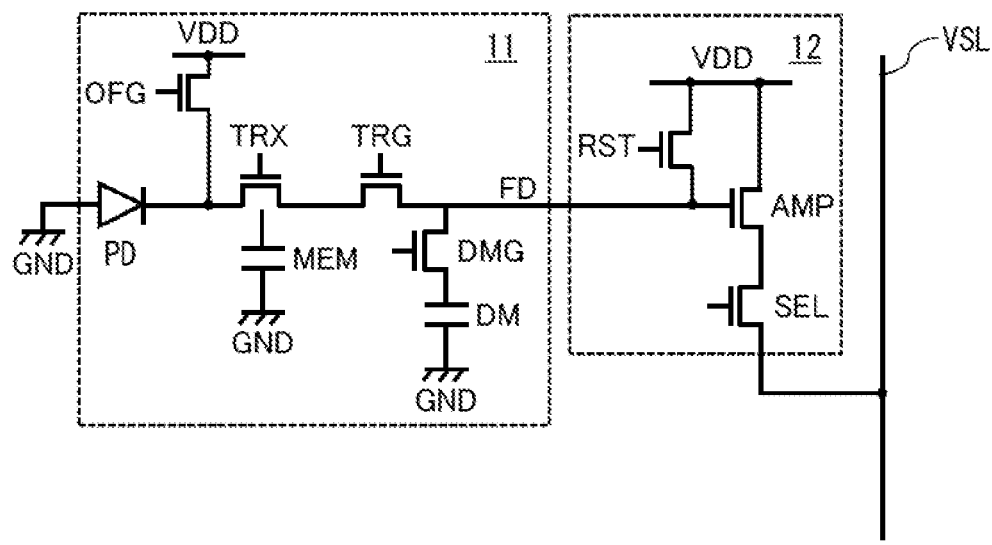
[FIG. 3]
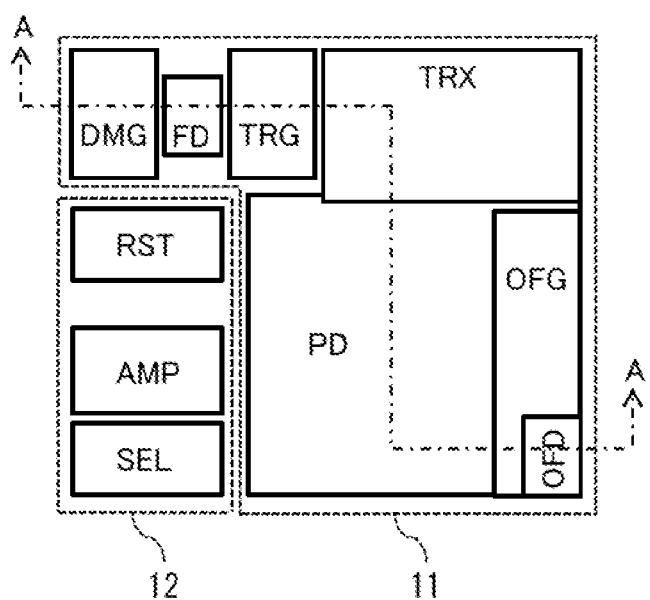

[ FIG. 4 ]
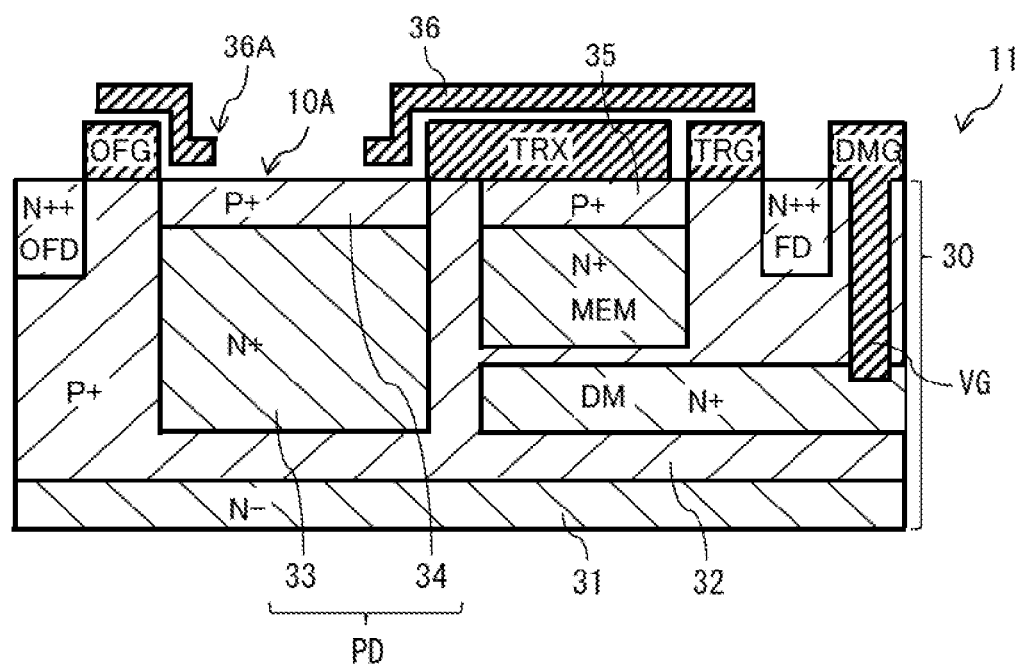
[ FIG. 5 ]
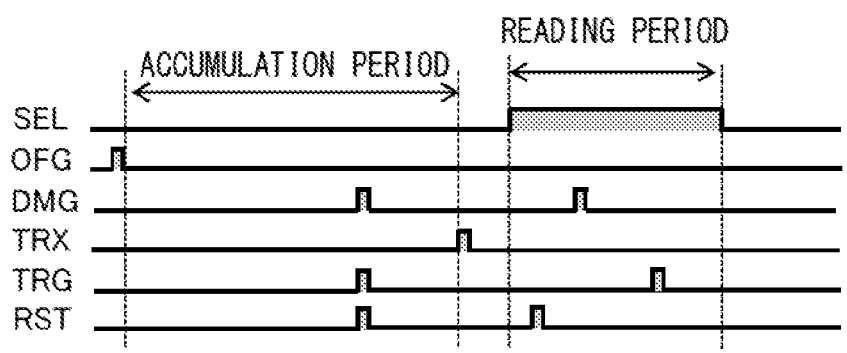

[ FIG. 6 ]
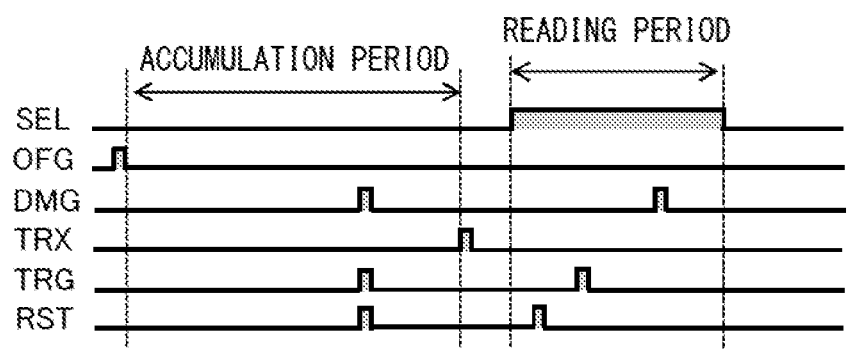
[ FIG. 7 ]
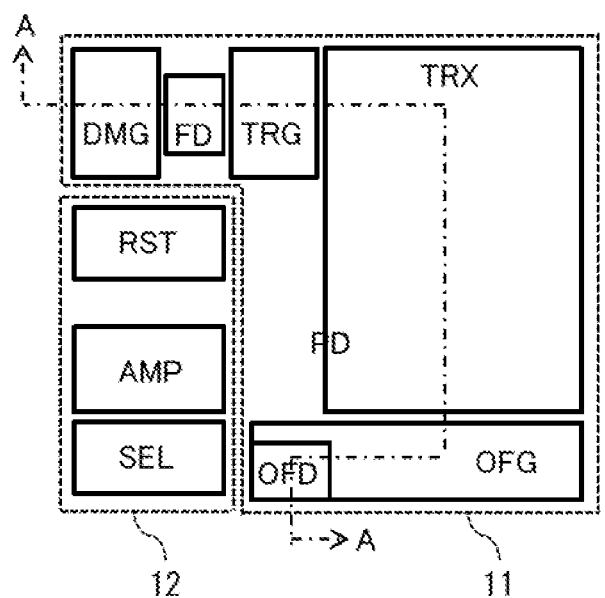

[ FIG. 8 ]
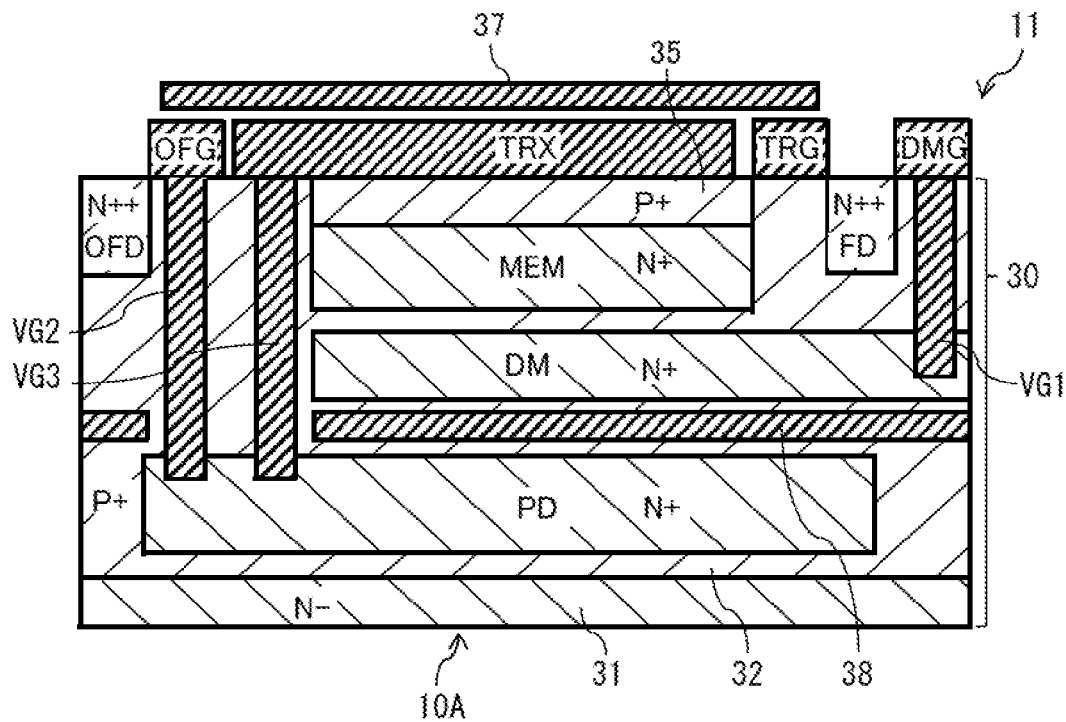
[ FIG. 9 ]
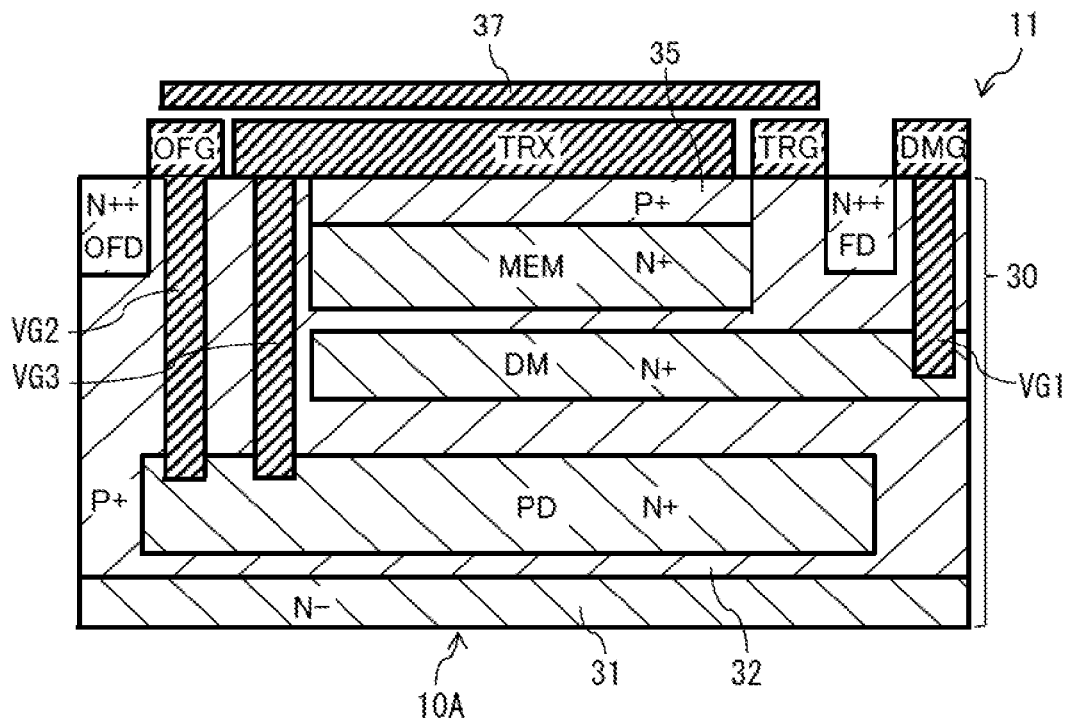

[ FIG. 10 ]
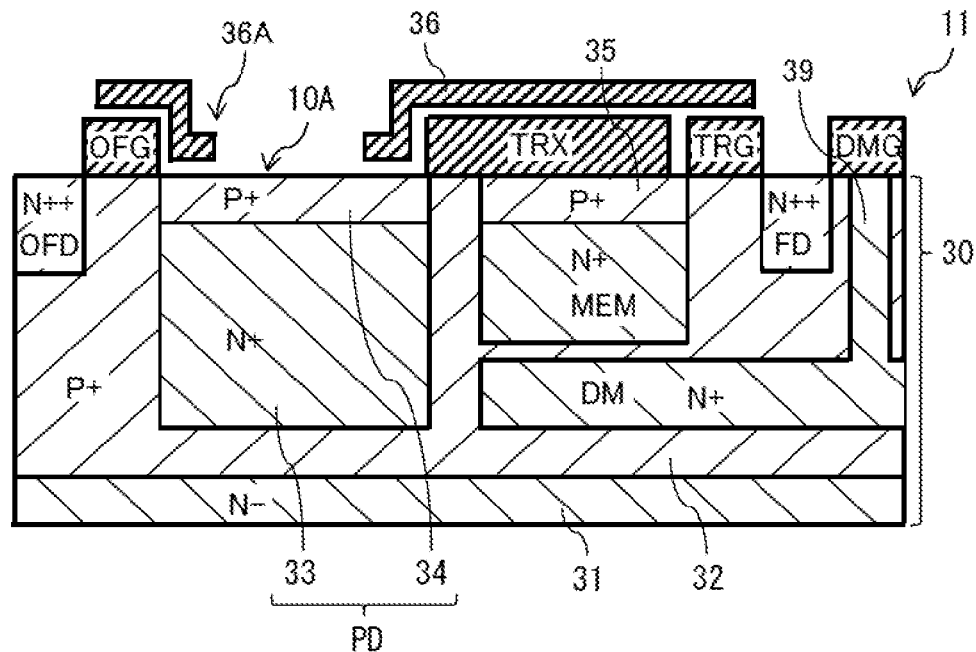
[ FIG. 11 ]
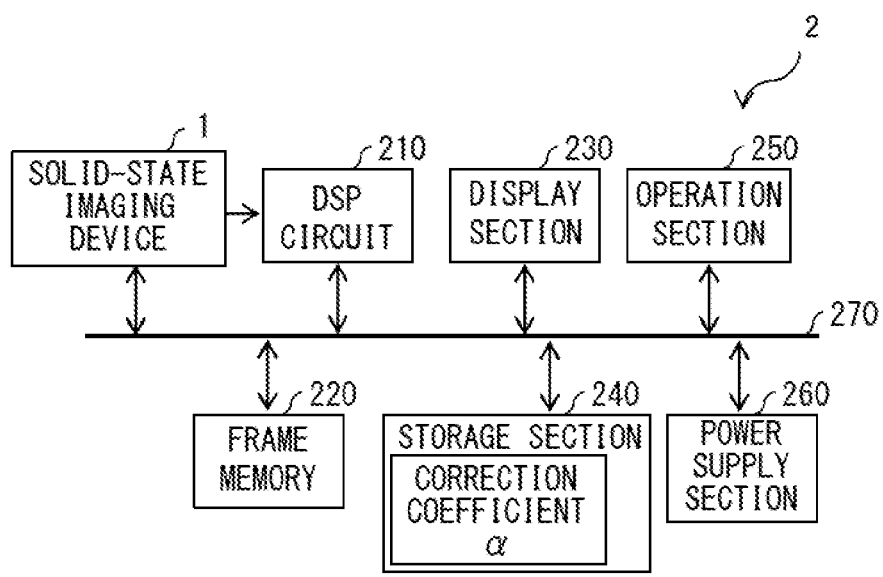

[ FIG. 12 ]
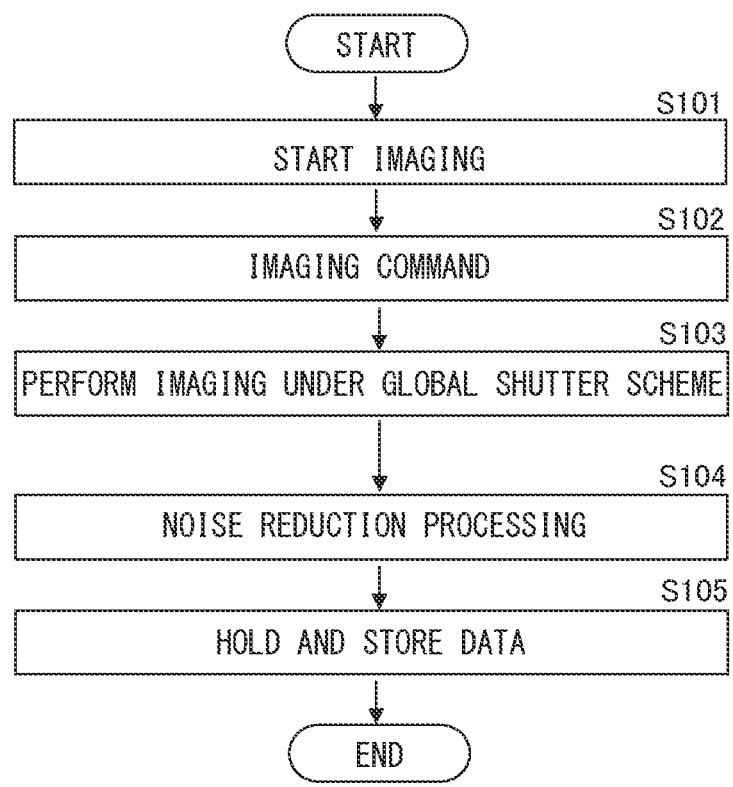

[ FIG. 13 ]
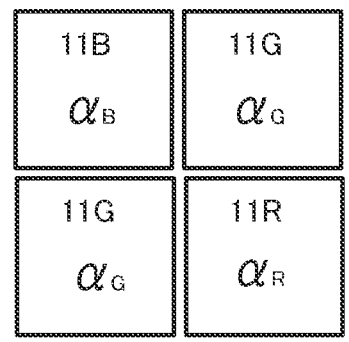
[ FIG. 14 ]
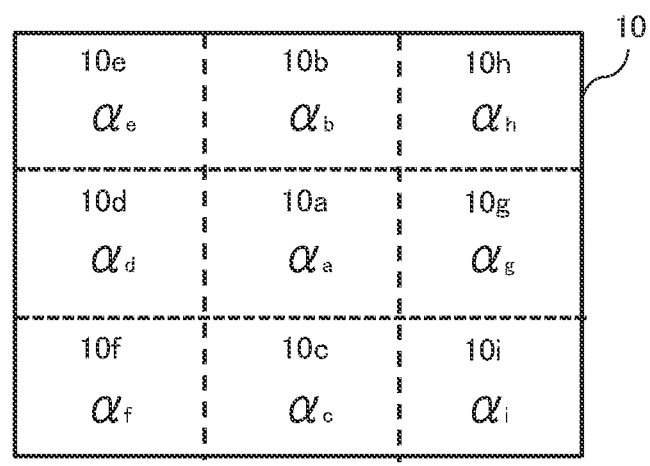

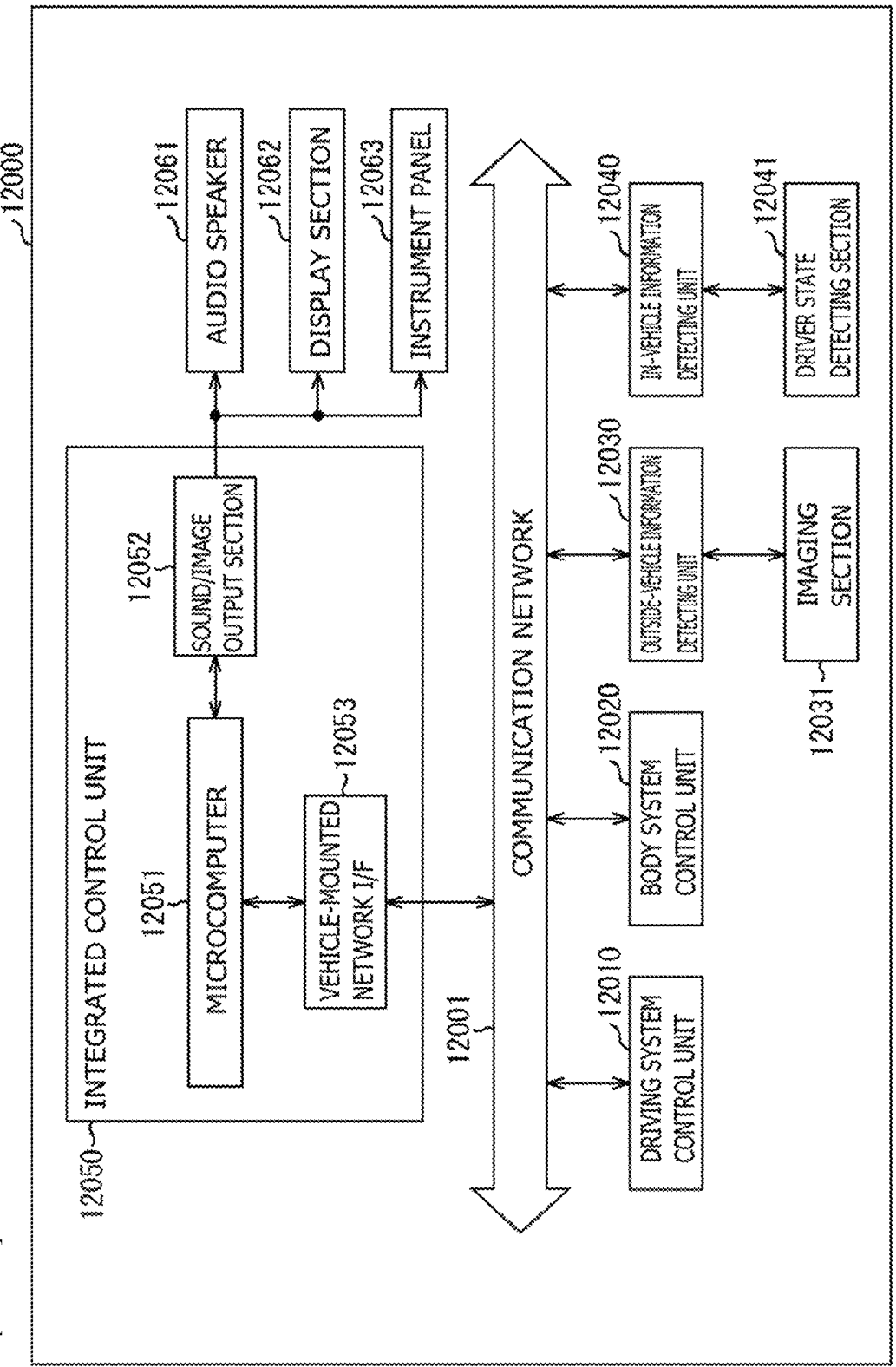
[FIG. 15]

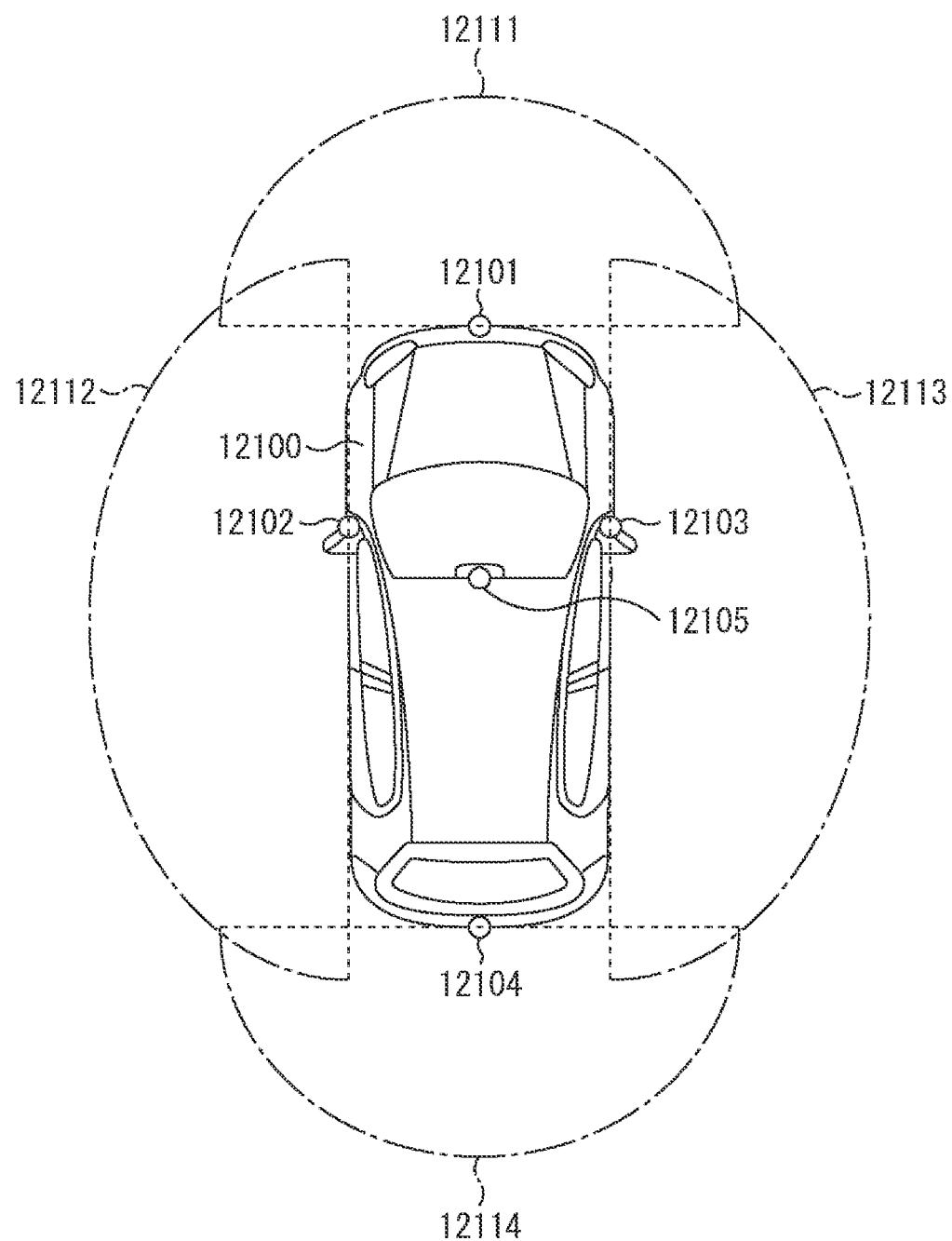
[ FIG. 16 ]

SOLID-STATE IMAGING DEVICE AND ELECTRONIC APPARATUS

TECHNICAL FIELD

The present disclosure relates to a solid-state imaging device and an electronic apparatus.

BACKGROUND ART

Solid-state imaging devices are used in electronic apparatuses including, for example, imaging units such as a digital still camera and a digital video camera, and mobile terminal units having an imaging function. Examples of the solid-state imaging devices include a CMOS (complementary MOS) image sensor that reads a charge accumulated in a photodiode, which serves as a photoelectric conversion element, via MOS (Metal Oxide Semiconductor) transistors (for example, see PTL 1).

In the CMOS image sensor that has a global shutter function, a charge accumulation section is provided in each pixel. Because a signal of a previous frame is held in the charge accumulation section, it is necessary to provide a structure that shields the charge accumulation section from light in order to prevent a signal of a next frame from entering the charge accumulation section. However, it is difficult to sufficiently prevent light from leaking into the charge accumulation section by simply providing such a structure. Given this situation, for example, methods described in PTLs 1 and 2 are conceivable as a measure to counter the issue.

CITATION LIST

Patent Literature

PTL 1: Japanese Unexamined Patent Application Publication No. 2013-150232
PTL 2: Japanese Unexamined Patent Application Publication No. 2012-175259

SUMMARY OF THE INVENTION

However, the method described in PTL 1 is disadvantageous in that the resolution is greatly reduced. Further, the method described in PTL 2 is disadvantageous in that it is difficult to accurately eliminate an influence of obliquely incident light leaking into the charge accumulation section, and furthermore, in that the conversion efficiency is low. Accordingly, it is desirable to provide a solid-state imaging device that makes it possible to accurately eliminate the influence of obliquely incident light leaking into the charge accumulation section while suppressing a decrease in resolution and a reduction in conversion efficiency, and an electronic apparatus including the solid-state imaging device.

A solid-state imaging device according to an embodiment of the present disclosure includes a light receiving surface, and two or more pixels opposed to the light receiving surface. Each of the pixels includes a photoelectric conversion section that performs photoelectric conversion on light entering via the light receiving surface, a first charge holding section that holds a charge transferred from the photoelectric conversion section, and a second charge holding section disposed at a position where all or a portion of the second charge holding section overlaps the first charge holding section in a planar layout, and formed to have no electrical continuity to the first charge holding section. Each of the pixels further includes a first transfer transistor that transfers the charge held by the first charge holding section to a floating diffusion, and a second transfer transistor that transfers a charge held by the second charge holding section to the floating diffusion.

An electronic apparatus according to an embodiment of the present disclosure includes a solid-state imaging device that outputs image data corresponding to entering light, and a signal processing circuit that processes the image data. The solid-state imaging device provided in the electronic apparatus has a configuration the same as that of the foregoing solid-state imaging device.

In the solid-state imaging device and the electronic apparatus according to the respective embodiments of the present disclosure, provided are the first charge holding section that holds the charge transferred from the photoelectric conversion section, and the second charge holding section formed to have no electrical continuity to the first charge holding section. This makes it possible to reduce, on the basis of a signal charge read from the first charge holding section and a noise charge read from the second charge holding section, a PLS (Parasitic Light Sensitivity) component contained in the signal charge. Further, in the solid-state imaging device and the electronic apparatus according to the respective embodiments of the present disclosure, all or a portion of the second charge holding section is disposed at a position overlapping the first charge holding section in a planar layout. This allows for more accurate estimation of the PLS component resulting from oblique incidence as compared with a case where the first charge holding section and the second charge holding section are disposed in parallel to each other in a planar layout. Further, in the solid-state imaging device and the electronic apparatus according to the respective embodiments of the present disclosure, the first transfer transistor is used in reading a charge from the first charge holding section, and the second transfer transistor is used in reading a charge from the second charge holding section. As a result, higher conversion efficiency is achieved as compared with a case where a switch element is kept on during reading of the charge from the first charge holding section.

BRIEF DESCRIPTION OF DRAWINGS

FIG. 1 is a diagram illustrating an example of a schematic configuration of a solid-state imaging device according to an embodiment of the present disclosure.

FIG. 2 is a diagram illustrating an example of circuit configurations of a sensor pixel and a read circuit in FIG. 1.

FIG. 3 is a diagram illustrating an example of a planar configuration of the sensor pixel in FIG. 1.

FIG. 4 is a diagram illustrating an example of a cross-sectional configuration along line A-A in FIG. 3.

FIG. 5 is a diagram illustrating an example of a timing chart during imaging by the solid-state imaging device including the sensor pixel in FIG. 4.

FIG. 6 is a diagram illustrating a modification example of the timing chart during imaging by the solid-state imaging device including the sensor pixel in FIG. 4.

FIG. 7 is a diagram illustrating a modification example of the planar configuration of the sensor pixel in FIG. 1.

FIG. 8 is a diagram illustrating an example of a cross-sectional configuration along line A-A in FIG. 7.

FIG. 9 is a diagram illustrating a modification example of the cross-sectional configuration along line A-A in FIG. 7.

FIG. 10 is a diagram illustrating a modification example of the cross-sectional configuration along line A-A in FIG. 3.

FIG. 11 is a diagram illustrating an example of a schematic configuration of an electronic apparatus including the solid-state imaging device according to any of the foregoing embodiment and modification examples thereof.

FIG. 12 is a diagram illustrating an example of an imaging procedure by the electronic apparatus in FIG. 11.

FIG. 13 is a diagram illustrating an example of a correction coefficient for each pixel.

FIG. 14 is a diagram illustrating an example of the correction coefficient for each pixel.

FIG. 15 is a block diagram depicting an example of schematic configuration of a vehicle control system.

FIG. 16 is a diagram of assistance in explaining an example of installation positions of an outside-vehicle information detecting section and an imaging section.

MODES FOR CARRYING OUT THE INVENTION

In the following, an embodiment of the present disclosure is described in detail with reference to the drawings. It is to be noted that the description is given in the following order.
1. Embodiment (Solid-State Imaging Device) . . . FIGS. 1 to 6
2. Modification Example (Solid-State Imaging Device) . . . FIGS. 7 to 10
3. Application Example (Electronic Apparatus) . . . FIGS. 11 to 14
4. Example of Practical Application . . . FIGS. 15 and 16

1. Embodiment

[Configuration]

A description will be given of a solid-state imaging device 1 according to an embodiment of the present disclosure. The solid-state imaging device 1 is, for example, a top-illumination type image sensor including a CMOS (Complementary Metal Oxide Semiconductor) image sensor or the like. The solid-state imaging device 1 receives light from a subject and performs photoelectric conversion on the light to generate an image signal, thereby capturing an image. The solid-state imaging device 1 outputs a pixel signal corresponding to entering light.

The top-illumination type image sensor is an image sensor having a configuration in which a photoelectric conversion section such as a photodiode is provided between a light receiving surface, on which light from a subject is incident, and a back surface of a semiconductor substrate. The photoelectric conversion section receives the light from the subject and converts the light into an electric signal. It is to be noted that the present disclosure is not limited to application to the CMOS image sensor.

FIG. 1 illustrates an example of a schematic configuration of the solid-state imaging device 1 according to the embodiment of the present disclosure. The solid-state imaging device 1 includes a pixel array section 10 and a logic circuit 20. The pixel array section 10 includes two or more sensor pixels 11 and two or more read circuits 12 (described later). The sensor pixel 11 corresponds to a specific example of a "pixel" of the present disclosure. Each of the sensor pixels 11 performs photoelectric conversion and outputs a charge corresponding to the amount of received light. The two or more sensor pixels 11 are opposed to a light receiving surface 10A (described later), and are arranged in a matrix in the pixel array section 10. Each of the read circuits 12 outputs a pixel signal or a noise signal (described later) based on the charge outputted from the sensor pixel 11. The two or more read circuits 12 are provided, for example, one for every single sensor pixel 11 in the pixel array section 10. It is to be noted that the two or more read circuits 12 may be provided one for every two or more of the sensor pixels 11 in the pixel array section 10.

The pixel array section 10 includes two or more pixel drive lines HSL and two or more data output lines VSL. The pixel drive line HSL is a wiring line that receives a control signal controlling the output of the charge accumulated in the sensor pixel 11. The pixel drive line HSL extends in the row direction, for example. The data output line VSL is a wiring line for outputting, to the logic circuit 20, the pixel signal or the noise signal outputted from each of the read circuits 12. The data output line VSL extends in the column direction, for example.

The logic circuit 20 includes, for example, a vertical drive circuit 21, a column signal processing circuit 22, a horizontal drive circuit 23, and a system control circuit 24. The logic circuit 20 (specifically, the horizontal drive circuit 23) outputs an output voltage for each of the sensor pixels 11 to external equipment, thereby supplying image data to the external equipment.

The vertical drive circuit 21 selects the two or more sensor pixels 11 sequentially on a predetermined pixel row unit basis, for example. The "predetermined pixel row unit" refers to a pixel row or pixel rows for which pixel selection is enabled by the same address. For example, in a case where a single sensor pixel 11 is assigned to a single read circuit 12, the "predetermined pixel row unit" refers to a single pixel row. Further, for example, in a case where two or more of the sensor pixels 11 share a single read circuit 12, if a layout of the two or more sensor pixels 11 that share the read circuit 12 is two pixel rows×n pixel columns (n is an integer of 1 or greater), the "predetermined pixel row unit" refers to two pixel rows. Similarly, if the layout of the two or more sensor pixels 11 that share the read circuit 12 is four pixel rows×n pixel columns (n is an integer of 1 or greater), the "predetermined pixel row unit" refers to four pixel rows. The vertical drive circuit 21 controls transistors (for example, transfer transistors TRX, TRG, and DMG and a discharge transistor OFG) in each of the sensor pixels 11 via the pixel drive line HSL, and further, controls transistors (for example, a reset transistor RST and a select transistor SEL) in each of the read circuits 12.

The column signal processing circuit 22 performs, for example, a correlated double sampling (Correlated Double Sampling: CDS) process on the pixel signal or the noise signal outputted from each of the sensor pixels 11 of the row(s) selected by the vertical drive circuit 21. By performing the CDS process, for example, the column signal processing circuit 22 extracts a signal level of the pixel signal or the noise signal and holds pixel data corresponding to the amount of light received by each of the pixels 11 or noise pixel data corresponding to the PLS. The column signal processing circuit 22 includes, for example, a column signal processing section for each of the data output lines VSL. The column signal processing section includes, for example, a single-slope A/D converter. The single-slope A/D converter includes, for example, a comparator and a counter circuit. The horizontal drive circuit 23 outputs, for example, the pixel data or noise pixel data held in the column signal processing circuit 22 to the outside sequentially. The system control circuit 24 controls, for example, driving of each of blocks (the vertical drive circuit 21, the column signal processing circuit 22, and the horizontal drive circuit 23) in the logic circuit 20.

FIG. 2 illustrates an example of circuit configurations of the sensor pixel 11 and the read circuit 12. In FIG. 2, the case where a single sensor pixel 11 is assigned to a single read circuit 12 is illustrated as an example. The sensor pixels 11 include components common to each other. Each of the sensor pixels 11 includes, for example, a photodiode PD, the transfer transistors TRX, TRG, and DMG, charge holding sections MEM and DM, a floating diffusion FD, the discharge transistor OFG, and a discharge floating diffusion OFD. The transfer transistors TRX, TRG, and DMG, and the discharge transistor OFG are, for example, NMOS (Metal Oxide Semiconductor) transistors.

The photodiode PD corresponds to a specific example of a "photoelectric conversion section" of the present disclosure. The charge holding section MEM corresponds to a specific example of a "first charge holding section" of the present disclosure. The charge holding section DM corresponds to a specific example of a "second charge holding section" of the present disclosure. The transfer transistor TRG corresponds to a specific example of a "first transistor" of the present disclosure. The transfer transistor DMG corresponds to a specific example of a "second transistor" of the present disclosure. The transfer transistor TRX corresponds to a specific example of a "third transistor" of the present disclosure.

The photodiode PD performs photoelectric conversion on light entering via the light receiving surface 10A (described later). The photodiode PD performs the photoelectric conversion to generate a charge corresponding to the amount of received light. The photodiode PD is, for example, a PN-junction photoelectric conversion element. A cathode of the photodiode PD is electrically coupled to a source of the transfer transistor TRX. An anode of the photodiode PD is electrically coupled to a reference potential line (for example, a ground GND).

The transfer transistor TRX is coupled between the photodiode PD and the transfer transistor TRG. The transfer transistor TRX controls a potential of the charge holding section MEM in response to a control signal applied to a gate of the transfer transistor TRX. For example, when the transfer transistor TRX is turned on, the potential of the charge holding section MEM becomes deep. Further, for example, when the transfer transistor TRX is turned off, the potential of the charge holding section MEM becomes shallow. Once the transfer transistor TRX has been turned on, a charge accumulated in the photodiode PD is transferred to the charge holding section MEM via the transfer transistor TRX. A drain of the transfer transistor TRX is electrically coupled to a source of the transfer transistor TRG. The gate of the transfer transistor TRX is coupled to the pixel drive line HSL.

The charge holding section MEM is an impurity semiconductor region in which the charge accumulated in the photodiode PD is temporarily held. The charge holding section MEM holds the charge transferred from the photodiode PD. The charge holding section DM is an impurity semiconductor region in which a charge for correction of PLS (Parasitic Light Sensitivity) is temporarily held. The charge holding section DM temporarily holds a charge generated by PLS. The charge holding section DM is an impurity semiconductor region formed to have no electrical continuity to the charge holding section MEM. The charge holding section MEM, the charge holding section DM, and the floating diffusion FD described later all include impurity semiconductor regions of a common electrical conductivity type. Further, the charge holding section MEM and the charge holding section DM each have an impurity concentration lower than an impurity concentration of the floating diffusion FD described later.

The PLS refers to stray light that occurs depending on an entering light amount when intense light enters the photodiode PD. If a charge generated by the stray light (hereinafter, referred to as "noise charge") gets into the charge holding section MEM, the noise charge is superimposed as a noise component on a charge held in the charge holding section MEM (hereinafter, referred to as "signal charge"). This results in noise being contained in the pixel signal, and therefore the resulting image suffers degradation of image quality. In order to remove the noise component from the pixel signal, the charge holding section DM holds a noise charge having a correlation to the noise charge to be superimposed on the signal charge.

The transfer transistor TRG is coupled between the transfer transistor TRX and the floating diffusion FD. The transfer transistor TRG transfers, in response to a control signal applied to a gate of the transfer transistor TRG, the charge held in the charge holding section MEM to the floating diffusion FD. For example, when the transfer transistor TRX is turned off and the transfer transistor TRG is turned on, the charge held in the charge holding section MEM is transferred to the floating diffusion FD via the transfer transistor TRG. The drain of the transfer transistor TRG is electrically coupled to the floating diffusion FD. A gate of the transfer transistor TRG is coupled to the pixel drive line HSL.

The transfer transistor DMG is coupled between the charge holding section DM and the floating diffusion FD. The transfer transistor DMG transfers, in response to a control signal applied to a gate of the transfer transistor DMG, the charge held in the charge holding section DM to the floating diffusion FD. For example, when the transfer transistor DMG is turned on, the charge held in the charge holding section DM is transferred to the floating diffusion FD via the transfer transistor DMG. A drain of the transfer transistor DMG is electrically coupled to the floating diffusion FD. The gate of the transfer transistor TRG is coupled to the pixel drive line HSL.

The floating diffusion FD is a floating diffusion region (impurity semiconductor region) in which the charge outputted from the photodiode PD via the transfer transistor TRX and the transfer transistor TRG is temporarily held. For example, the reset transistor RST is coupled to the floating diffusion FD. The vertical signal line VSL is also coupled to the floating diffusion FD via an amplifier transistor AMP and the select transistor SEL. Furthermore, the floating diffusion FD is a floating diffusion region in which the charge outputted from the charge holding section DM via the transfer transistor DMG is temporarily held.

The discharge transistor OFG is coupled between the photodiode PD and a power supply line VDD. The discharge transistor OFG initializes (resets) the photodiode PD in response to a control signal applied to a gate of the discharge transistor OFG. For example, when the discharge transistor OFG is turned on, a potential of the photodiode PD is reset to a potential level of the power supply line VDD. In other words, the photodiode PD is initialized. Further, the discharge transistor OFG forms, for example, an overflow path between the transfer transistor TRX and the power supply line VDD, and discharges a charge overflowing from the photodiode PD to the power supply line VDD. A drain of the discharge transistor OFG is coupled to the power supply line VDD, and a source of the discharge transistor OFG is coupled between the photodiode PD and the transfer transistor TRX. The gate of the discharge transistor OFG is coupled to the pixel drive line HSL.

The reset transistor RST is coupled between the floating diffusion FD and the power supply line VDD. The reset transistor RST initializes (resets) each of the regions from the charge holding section MEM to the floating diffusion FD in response to a control signal applied to a gate of the reset transistor RST. For example, when the transfer transistors TRG and DMG and the reset transistor RST are turned on, potentials of the charge holding sections MEM and DM and the floating diffusion FD are reset to the potential level of the power supply line VDD. In other words, the charge holding sections MEM and DM and the floating diffusion FD are initialized. A drain of the reset transistor RST is coupled to the power supply line VDD, and a source of the reset transistor RST is coupled to the floating diffusion FD. The gate of the reset transistor RST is coupled to the pixel drive line HSL.

The amplifier transistor AMP has a gate coupled to the floating diffusion FD, a drain coupled to the power supply line VDD, and a source coupled to a drain of the select transistor SEL. The amplifier transistor AMP serves as an input section of a source follower circuit which reads a charge obtained by photoelectric conversion at the photodiode PD or a charge accumulated in the charge holding section DM. Because the source of the amplifier transistor AMP is coupled to the vertical signal line VSL via the select transistor SEL, the amplifier transistor AMP constitutes the source follower circuit together with a constant current source coupled to one end of the vertical signal line VSL. The amplifier transistor AMP converts the charge obtained by photoelectric conversion at the photodiode PD into a pixel signal, and outputs the pixel signal to the vertical signal line VSL via the select transistor SEL. Further, the amplifier transistor AMP converts the charge accumulated in the charge holding section DM into a noise signal, and outputs the noise signal to the vertical signal line VSL via the select transistor SEL.

The select transistor SEL has the drain coupled to the source of the amplifier transistor AMP, a source coupled to the vertical signal line VSL, and a gate coupled to the pixel drive line HSL. The select transistor SEL controls, in response to a control signal applied to the gate of the select transistor SEL, the output of the pixel signal or the noise signal outputted from the amplifier transistor AMP to the vertical signal line VSL. The select transistor SEL is brought into a conducting state when the control signal is turned on, and the sensor pixel 11 coupled to the select transistor SEL is brought into a selected state. When the sensor pixel 11 is brought into the selected state, the pixel signal or the noise signal outputted from the amplifier transistor AMP is read out to the column signal processing circuit 22 via the vertical signal line VSL.

Next, the configuration of the sensor pixel 11 will be described in detail. FIG. 3 illustrates an example of a planar configuration of the sensor pixel 11. FIG. 4 illustrates an example of a cross-sectional configuration along line A-A in FIG. 3. FIGS. 3 and 4 are schematic diagrams and not necessarily drawn to scale. In FIG. 4, intensities of impurity concentrations are represented by symbols including "P+", "N−", "N+", and "N++". Here, in the locations denoted as "P+", for example, the concentration of a p-type impurity (acceptor) has a value higher than a value within a range from $1 \times 10^{16}$ cm$^{-3}$ to $5 \times 10^{18}$ cm$^{-3}$. "N+" indicates that the concentration of an n-type impurity (donor) is higher than "N−". "N++" indicates that the concentration of the n-type impurity (donor) is higher than "N+". In the location denoted as "N−", for example, the concentration of the n-type impurity (donor) has a value within the range from $1 \times 10^{16}$ cm$^{-3}$ to $5 \times 10^{18}$ cm$^{-1}$.

The sensor pixels 11 are formed on a semiconductor substrate 30. The semiconductor substrate 30 is a silicon substrate, for example. The semiconductor substrate 30 includes a p-well layer 32 at and in the vicinity of a top surface of the semiconductor substrate 30, and includes an n-type semiconductor layer 31 at a location deeper than the p-well layer 32. The p-well layer 32 is a p-type semiconductor region formed at and in the vicinity of the top surface of the semiconductor substrate 30. In the p-well layer 32, an n-type semiconductor region 33 and a p-type semiconductor region 34 are formed. The p-type semiconductor region 34 is formed at the top surface of the semiconductor substrate 30 and is in contact with the n-type semiconductor region 33. The n-type semiconductor region 33 and the p-type semiconductor region 34 are stacked in the thickness direction (normal direction) of the semiconductor substrate 30, and constitute the photodiode PD. The photodiode PD is disposed at a position adjacent to the charge holding section MEM and the charge holding section DM in a planar layout. Of the top surface of the semiconductor substrate 30, a region where the p-type semiconductor region 34 is formed is the light receiving surface 10A. The light receiving surface 10A is formed at a position on the transfer transistor TRX side in terms of positional relationship with the photodiode PD.

The charge holding section MEM is formed at a location in the p-well layer 32 opposed to the gate of the transfer transistor TRX. The charge holding section MEM is formed at a predetermined depth from the top surface of the semiconductor substrate 30. The charge holding section MEM includes a semiconductor region of an n-type impurity formed in the p-well layer 32. A p-type semiconductor region 35 is formed between the top surface of the semiconductor substrate 30 and the charge holding section MEM.

The charge holding section DM is formed at a position in the p-well layer 32 where all or a portion of the charge holding section DM overlaps the charge holding section MEM in a planar layout. In other words, the sensor pixel 11 includes the charge holding section DM at the position in the p-well layer 32 where all or a portion of the charge holding section DM overlaps the charge holding section MEM in a planar layout. The p-type semiconductor region 35, the charge holding section MEM, and the charge holding section DM are disposed in this order from the top surface (or the light receiving surface 10A) side of the semiconductor substrate 30 in the p-well layer 32. The charge holding section DM includes a semiconductor region of an n-type impurity formed in the p-well layer 32. The charge holding section DM is formed to have no electrical continuity to the charge holding section MEM. The concentration of the n-type impurity (donor) in each of the charge holding section MEM and the charge holding section DM is lower than the concentration of the n-type impurity (donor) in the floating diffusion FD.

The floating diffusion FD and the discharge floating diffusion OFD are formed around a region including the photodiode PD, the p-type semiconductor region 35, and the charge holding section DM. In other words, the sensor pixel 11 includes the floating diffusion FD and the discharge floating diffusion OFD around the region including the photodiode PD, the p-type semiconductor region 35, and the charge holding section DM. The floating diffusion FD and the discharge floating diffusion OFD both include semiconductor regions formed in the p-well layer 32 and having high n-type impurity concentrations.

The transfer transistor DMG is formed in the vicinity of the floating diffusion FD. In other words, the sensor pixel 11 includes the transfer transistor DMG in the vicinity of the floating diffusion FD. The transfer transistor DMG includes a vertical gate VG reaching the charge holding section DM. The vertical gate VG includes a metal material, for example. The discharge transistor OFG is formed in the vicinity of the discharge floating diffusion OFD. In other words, the sensor pixel 11 includes the discharge transistor OFG in the vicinity of the discharge floating diffusion OFD.

The sensor pixel 11 includes a light blocking layer 36 on the semiconductor substrate 30. The light blocking layer 36 has an opening 36A at a position facing the photodiode PD. The light receiving surface 10A is exposed in the opening 36A. The light blocking layer 36 is disposed at a position around the light receiving surface 10A and opposed to at least the photoelectric conversion section MEM. The light blocking layer 36 includes a metal material, for example.

[Operation]

Next, an imaging operation by the solid-state imaging device 1 according to the present embodiment will be described.

The solid-state imaging device 1 (specifically, the system control circuit 24) performs the imaging operation under a global shutter scheme in accordance with an imaging command from an operation section 250 to be described later. According to the global shutter scheme, a charge of the current frame is accumulated in the charge holding section MEM of each of the sensor pixels 11, and thereafter the charge accumulated in the charge holding section MEM of each of the sensor pixels 11 is read sequentially. FIG. 5 illustrates an example of a timing chart during the imaging operation by the solid-state imaging device 1.

First, prior to starting imaging, the solid-state imaging device 1 (specifically, the system control circuit 24) turns on the discharge transistor OFG and discharges an excess charge remaining in the photodiode PD to the outside. Thereafter, the solid-state imaging device 1 (specifically, the system control circuit 24) starts imaging. Specifically, the solid-state imaging device 1 (specifically, the system control circuit 24) starts accumulating a charge while the transfer transistors TRX, TRG, and DMG and the discharge transistor OFG are in an off-state. When light enters the photodiode PD via the light receiving surface 10A, a charge is generated by photoelectric conversion at the photodiode PD. The charge generated at the photodiode PD starts accumulating in the photodiode PD.

Thereafter, prior to transferring the charge accumulated in the photodiode PD to the charge holding section MEM, the solid-state imaging device 1 (specifically, the system control circuit 24) turns on the transfer transistors TRG and DMG and the reset transistor RST to discharge an excess charge remaining in each of the charge holding section MEM and the floating diffusion FD to the outside. Subsequently, prior to completion of photoelectric conversion at the photodiode PD, the solid-state imaging device 1 (specifically, the system control circuit 24) turns on the transfer transistor TRX and deepens the potential of the charge holding section MEM to thereby transfer the charge accumulated in the photodiode PD to the charge holding section MEM. At this time, the solid-state imaging device 1 (specifically, the system control circuit 24) performs this transfer operation on all the sensor pixels 11 simultaneously.

Upon completion of the photoelectric conversion at the photodiode PD, the solid-state imaging device 1 (specifically, the system control circuit 24) turns off the transfer transistor TRX and confines the charge resulting from imaging of the current frame into the charge holding section MEM. Thereafter, the solid-state imaging device 1 (specifically, the system control circuit 24) turns on the reset transistor RST and discharges again an excess charge remaining in the floating diffusion FD to the outside.

Next, the solid-state imaging device 1 (specifically, the system control circuit 24) turns on the transfer transistor DMG and discharges (transfers) the charge accumulated in the charge holding section DM to the floating diffusion FD. At this time, the solid imaging device 1 (specifically, the system control circuit 24) keeps the select transistor SEL on. Through this process, a noise signal at a signal level corresponding to the potential of the floating diffusion FD is generated at the amplifier transistor AMP, and the generated noise signal is outputted to the vertical signal line VSL via the select transistor SEL. The noise signal is generated on the basis of a noise charge having a correlation to the noise charge to be superimposed on the signal charge accumulated in the charge holding section MEM. The solid-state imaging device 1 (specifically, the system control circuit 24) performs this read operation for each predetermined pixel row unit.

Subsequently, the solid-state imaging device 1 (specifically, the system control circuit 24) turns on the transfer transistor TRG and discharges (transfers) the charge accumulated in the charge holding section MEM to the floating diffusion FD. At this time, the solid imaging device 1 (specifically, the system control circuit 24) keeps the select transistor SEL on. Through this process, a pixel signal at a signal level corresponding to the potential of the floating diffusion FD is generated at the amplifier transistor AMP, and the generated pixel signal is outputted to the vertical signal line VSL via the select transistor SEL. The solid-state imaging device 1 (specifically, the system control circuit 24) performs this read operation for each predetermined pixel row unit. In this way, the imaging operation of the solid-state imaging device 1 according to the present embodiment is performed.

It is to be noted that the solid-state imaging device 1 (specifically, the system control circuit 24) may, for example, as illustrated in FIG. 6, execute the operation of reading the charge from the charge holding section MEM prior to the operation of reading the charge from the charge holding section DM.

[Effects]

Next, the effects of the solid-state imaging device 1 according to the present embodiment will be described.

In the CMOS image sensors having a global shutter function, a charge accumulation section is provided in each pixel. Because a signal of a previous frame is held in the charge accumulation section, it is necessary to provide a structure that shields the charge accumulation section from light in order to prevent a signal of a next frame from entering the charge accumulation section. However, it is difficult to sufficiently prevent light from leaking into the charge accumulation section by simply providing such a structure. Given this situation, for example, the methods described in foregoing PTLs 1 and 2 are conceivable as a measure to counter the issue.

In PTL 1, one of pixels shared by two or more pixels is used as a pixel for PLS correction. However, in such a case, a great reduction in resolution results because the pixel for PLS correction is embedded in a pixel array.

In PTL 2, similarly to the present embodiment, a charge accumulation section for PLS correction is provided. However, in PTL 2, the charge accumulation section for PLS correction is disposed next to the floating diffusion. This makes it difficult to accurately eliminate the PLS component resulting from oblique incidence. For example, in a case where the photodiode is formed to be adjacent to the charge accumulation section for PLS correction and the floating diffusion, if light is obliquely incident on the photodiode from the side of the charge accumulation section for PLS correction, more noise charge is accumulated in the floating diffusion than in the charge accumulation section for PLS correction. Conversely, in a case where light is obliquely incident on the photodiode from the side of the floating diffusion, more noise charge is accumulated in the charge accumulation section for PLS correction than in the floating diffusion. Thus, the ratio between the noise charge to be accumulated in the floating diffusion and the noise charge to be accumulated in the charge accumulation section for PLS correction varies depending on the incidence direction of light. Accordingly, it is difficult with the method described in PTL 2 to accurately remove the noise component from the pixel signal. In addition, in PTL 2, a switch element is provided between the floating diffusion and the amplifier transistor, and further, a switch element is provided also between the charge accumulation section for PLS correction and the amplifier transistor. It is therefore necessary to keep the switch between the floating diffusion and the amplifier transistor on w % ben reading a charge from the floating diffusion. As a result, the read operation is performed in a state where the conversion efficiency is low.

In contrast, in the present embodiment, provided are the charge holding section MEM holding the charge transferred from the photodiode PD, and the charge holding section DM formed to have no electrical continuity to the charge holding section MEM. This makes it possible to reduce the PLS component contained in the signal charge on the basis of the signal charge read from the charge holding section MEM and the noise charge read from the charge holding section DM. Further, in the present embodiment, all or a portion of the charge holding section DM is disposed at a position overlapping the charge holding section MEM in a planar layout. This allows for more accurate estimation of the PLS component resulting from oblique incidence as compared with a case where the charge holding section MEM and the charge holding section DM are disposed in parallel to each other in a planar layout. Further, in the present embodiment, the transfer transistor TRG is used in reading the charge from the charge holding section MEM, and the transfer transistor DMG is used in reading the charge from the charge holding section DM. As a result, higher conversion efficiency is achieved as compared with the case where the switch element is kept in an on-state when reading the charge from the charge holding section MEM. It is therefore possible to accurately eliminate the influence of obliquely incident light leaking into the charge accumulation section while suppressing a decrease in resolution and a reduction in conversion efficiency.

Further, in the present embodiment, the charge holding section MEM, the charge holding section DM, and the floating diffusion FD all include impurity semiconductor regions of a common electrical conductivity type. Further, the impurity concentrations of the charge holding section MEM and the charge holding section DM are lower than the impurity concentration of the floating diffusion FD. This causes the charge holding section MEM and the charge holding section DM to have a potential difference from the floating diffusion FD, thus making it possible to achieve complete discharge of the charge from each of the charge holding section MEM and the charge holding section DM.

Further, in the present embodiment, the transfer transistor DMG includes the vertical gate VG reaching the charge holding section DM. This make it possible to perform the transfer of the charge from the charge holding section DM with reliability.

Further, in the present embodiment, the photodiode PD is disposed at a position adjacent to the charge holding section MEM and the charge holding section DM in a planar layout. Furthermore, the light receiving surface 10A is formed at a position on the transfer transistor DMG side in terms of positional relationship with the photodiode PD. In other words, the solid-state imaging device 1 according to the present embodiment is a top-illumination type image sensor. Thus, the present disclosure is also applicable to the top-illumination type image sensor.

Further, in the present embodiment, each of the sensor pixels 11 includes the light blocking layer 36 disposed at a position around the light receiving surface 10A and opposed to the charge holding section DM. This makes it possible to reduce direct entry of external light into the charge holding section DM without passing through the light receiving surface 10A. As a result, it is possible to reduce mixing of a noise component into the charge to be read from the charge holding section DM.

2. Modification Example

The following describes modification examples of the solid-state imaging device 1 according to the embodiment described above.

[Modification Example A]

In the embodiment described above, the light receiving surface 10A may be provided at the back surface of the semiconductor substrate 30. FIG. 7 illustrates a modification example of the planar configuration of the sensor pixel 11. FIG. 8 illustrates an example of the cross-sectional configuration along line A-A in FIG. 7. FIGS. 7 and 8 are schematic diagrams and not necessarily drawn to scale. In FIG. 8, intensities of impurity concentrations are represented by symbols including "P+", "N−", "N+", and "N++". Here, in the locations denoted as "P+", for example, the concentration of the p-type impurity (acceptor) has a value higher than a value within the range from $1\times10^{16}$ cm$^{-3}$ to $5\times10^{18}$ cm$^{-3}$. "N+" indicates that the concentration of the n-type impurity (donor) is higher than "N−". "N++" indicates that the concentration of the n-type impurity (donor) is higher than "N+". In the location denoted as "N−", for example, the concentration of the n-type impurity (donor) has a value within the range from $1\times10^{16}$ cm$^{-3}$ to $5\times10^{18}$ cm$^{-3}$.

The sensor pixels 11 are formed on the semiconductor substrate 30. The semiconductor substrate 30 is a silicon substrate, for example. The semiconductor substrate 30 includes the p-well layer 32 at and in the vicinity of the top surface of the semiconductor substrate 30, and includes the n-type semiconductor layer 31 at a location deeper than the p-well layer 32. The p-well layer 32 is a p-type semiconductor region formed at and in the vicinity of the top surface of the semiconductor substrate 30. In the p-well layer 32, the photodiode PD is formed. The photodiode PD includes, for example, an n-type semiconductor region formed in the p-well layer 32. The photodiode PD is disposed at a position where a portion of the photodiode PD overlaps the charge holding section MEM and the charge holding section DM in a planar layout. Of the back surface of the semiconductor substrate 30, a region opposed to the photodiode PD is the light receiving surface 10A. The light receiving surface 10A is formed at a position on the opposite side from the transfer transistor TRX in terms of positional relationship with the photodiode PD.

The charge holding section MEM is formed at a location in the p-well layer 32 opposed to the gate of the transfer transistor TRX. The charge holding section MEM is formed at a predetermined depth from the top surface of the semiconductor substrate 30. The charge holding section MEM includes a semiconductor region of an n-type impurity formed in the p-well layer 32. The p-type semiconductor region 35 is formed between the top surface of the semiconductor substrate 30 and the charge holding section MEM.

The charge holding section DM is formed at a position in the p-well layer 32 where all or a portion of the charge holding section DM overlaps the charge holding section MEM in a planar layout. In other words, the sensor pixel 11 includes the charge holding section DM at the position in the p-well layer 32 where all or a portion of the charge holding section DM overlaps the charge holding section MEM in a planar layout. Furthermore, the photodiode PD is disposed at a position where a portion of the photodiode PD overlaps the charge holding section MEM and the charge holding section DM in a planar layout. Thus, the photodiode PD, the charge holding section DM, the charge holding section MEM, and the p-type semiconductor region 35 are disposed in this order from the back surface (the light receiving surface 10A) side of the semiconductor substrate 30 in the p-well layer 32. The charge holding section DM includes a semiconductor region of an n-type impurity formed in the p-well layer 32. The charge holding section DM is formed to have no electrical continuity to the charge holding section MEM. The concentration of the n-type impurity (donor) in each of the charge holding section MEM and the charge holding section DM is lower than the concentration of the n-type impurity (donor) in the floating diffusion FD.

The floating diffusion FD and the discharge floating diffusion OFD are formed around a region including the photodiode PD, the charge holding section DM, the charge holding section MEM, and the p-type semiconductor region 35. In other words, the sensor pixel 11 includes the floating diffusion FD and the discharge floating diffusion OFD around the region including the photodiode PD, the charge holding section DM, the charge holding section MEM, and the p-type semiconductor region 35. The floating diffusion FD and the discharge floating diffusion OFD both include semiconductor regions formed in the p-well layer 32 and having high n-type impurity concentrations.

The transfer transistor DMG is formed in the vicinity of the floating diffusion FD. In other words, the sensor pixel 11 includes the transfer transistor DMG in the vicinity of the floating diffusion FD. The transfer transistor DMG includes a vertical gate VG1 reaching the charge holding section DM. The vertical gate VG1 includes a metal material, for example.

The discharge transistor OFG is formed in the vicinity of the discharge floating diffusion OFD. In other words, the sensor pixel 11 includes the discharge transistor OFG in the vicinity of the discharge floating diffusion OFD. The discharge transistor OFG includes a vertical gate VG2 reaching the photodiode PD. The vertical gate VG2 includes a metal material, for example.

The sensor pixel 11 includes the transfer transistor TRX at a location opposed to the photoelectric conversion section MEM. The transfer transistor TRX includes a vertical gate VG3 reaching the photodiode PD. The vertical gate VG3 includes a metal material, for example.

The sensor pixel 11 includes a light blocking layer 37 on the semiconductor substrate 30. The light blocking layer 37 is disposed at a position opposed to at least the photoelectric conversion section MEM. The light blocking layer 36 includes a metal material, for example. The sensor pixel 11 further includes a light blocking layer 38 between the photodiode PD and the charge holding section DM. The light blocking layer 38 is disposed at a position opposed to the photoelectric conversion section MEM and the photoelectric conversion section DM, for example. The light blocking layers 37 and 38 include a metal material, for example. It is to be noted that as illustrated in FIG. 9, for example, the light blocking layer 38 may be omitted on an as-needed basis.

In the present modification example, as with the foregoing embodiment, provided are the charge holding section MEM holding the charge transferred from the photodiode PD, and the charge holding section DM formed to have no electrical continuity to the charge holding section MEM. This makes it possible to reduce the PLS component contained in the signal charge on the basis of the signal charge read from the charge holding section MEM and the noise charge read from the charge holding section DM. Further, in the present embodiment, all or a portion of the charge holding section DM is disposed at a position overlapping the charge holding section MEM in a planar layout. This allows for more accurate estimation of the PLS component resulting from oblique incidence as compared with a case where the charge holding section MEM and the charge holding section DM are disposed in parallel to each other in a planar layout. Further, in the present embodiment, the transfer transistor TRG is used in reading the charge from the charge holding section MEM, and the transfer transistor DMG is used in reading the charge from the charge holding section DM. As a result, higher conversion efficiency is achieved as compared with the case where the switch element is kept on during reading of the charge from the charge holding section MEM. It is therefore possible to accurately eliminate the influence of obliquely incident light leaking into the charge accumulation section while suppressing a decrease in resolution and a reduction in conversion efficiency.

Further, in the present modification example, the transfer transistor DMG includes the vertical gate VG1 reaching the charge holding section DM. This make it possible to perform the transfer of the charge from the charge holding section DM with reliability.

Further, in the present modification example, the photodiode PD is disposed at a position where a portion of the photodiode PD overlaps the charge holding section MEM and the charge holding section DM in a planar layout. Furthermore, the light receiving surface 10A is formed at a position on the opposite side from the transfer transistor DMG side in terms of positional relationship with the photodiode PD. In other words, the solid-state imaging device 1 according to the present modification example is a back-illumination type image sensor. Thus, the present disclosure is also applicable to the back-illumination type image sensor.

Further, in the present embodiment, each of the sensor pixels 11 includes the light blocking layer 38 between the photodiode PD and the charge holding section DM. This makes it possible to reduce direct entry of external light into the charge holding section DM without passing through the light receiving surface 10A. As a result, it is possible to reduce mixing of a noise component into the charge to be read from the charge holding section DM.

[Modification Example B]

In the foregoing embodiment, for example, the vertical gate VG may be omitted as illustrated in FIG. 10. In this case, instead of the vertical gate VG, an n-type semiconductor region 39 reaching the charge holding section DM and having an impurity concentration higher than that of the charge holding section DM is formed in the p-well layer 32. In other words, in the present modification example, each of the sensor pixels 11 includes the n-type semiconductor region 39 reaching the charge holding section DM and having an impurity concentration higher than that of the charge holding section DM. Even in such a case, it is possible to perform the transfer of the charge from the charge holding section DM with reliability.

3. Application Example

The present disclosure is not limited to application to a solid-state imaging device. More specifically, the present technology is applicable not only to a solid-state imaging device but also to any electronic apparatus that includes a solid-state imaging device, such as a camera module including an optical lens system or the like, an imaging unit such as a digital still camera or a video camera, a mobile terminal unit having an imaging function (for example, a smartphone or a tablet terminal), or a copying machine using a solid-state imaging device in an image reading section.

FIG. 11 is a block diagram illustrating a configuration example of an electronic apparatus 2 including the solid-state imaging device 1 according to any of the foregoing embodiment and modification examples thereof.

The electronic apparatus 2 is, for example, any of electronic apparatuses including imaging units such as a digital still camera or a video camera, and mobile terminal units such as a smartphone or a tablet terminal. The electronic apparatus 2 includes, for example, the solid-state imaging device 1 according to any of the foregoing embodiment and modification examples thereof, a DSP circuit 210, a frame memory 220, a display section 230, a storage section 240, an operation section 250, and a power supply section 260. The DSP circuit 210 corresponds to a specific example of a "signal processing circuit" of the present disclosure. In the electronic apparatus 2, the DSP circuit 210, the frame memory 220, the display section 230, the storage section 240, the operation section 250, and the power supply section 260 are coupled to each other via a bus line 270.

The solid-state imaging device 1 according to any of the foregoing embodiment and modification examples thereof outputs image data corresponding to entering light. The DSP circuit 210 is a signal processing circuit that processes a signal (image data) outputted from the solid-state imaging device 1 according to any of the foregoing embodiment and modification examples thereof. The frame memory 220 temporarily holds the image data processed by the DSP circuit 210 on a frame-by-frame basis. The display section 230 includes, for example, a display of a panel type such as a liquid crystal panel or an organic EL (Electro Luminescence) panel, and displays a moving image or a still image captured by the solid-state imaging device 1 according to any of the foregoing embodiment and modification examples thereof. The storage section 240 stores image data of the moving image or the still image captured by the solid-state imaging device 1 according to any of the foregoing embodiment and modification examples thereof in a storage medium such as a semiconductor memory or a hard disk. The storage section 240 further stores a correction coefficient α to be described later in the storage medium such as the semiconductor memory or the hard disk. The operation section 250 outputs an operation command for various kinds of functions of the electronic apparatus 2 in accordance with user's operations. The power supply section 260 appropriately supplies various kinds of power serving as operation power sources for the DSP circuit 210, the frame memory 220, the display section 230, the storage section 240, and the operation section 250, to these targets of supply.

Next, a description will be given of an imaging procedure by the electronic apparatus 2.

FIG. 12 illustrates an example of a flowchart of the imaging operation by the electronic apparatus 2. The user operates the operation section 250 to instruct to start imaging (step S101). The operation section 250 then transmits an imaging command to the solid-state imaging device 1 (step S102). Upon receiving the imaging command, the solid-state imaging device 1 (specifically, the system control circuit 24) performs imaging under the global shutter operation (step S103).

The solid-state imaging device 1 outputs image data $I_1$ and noise image data 12 obtained by imaging to the DSP circuit 210. Here, the image data $I_1$ is data of pixel signals for all the pixels, the pixel signals having been generated on the basis of the charge accumulated in the charge holding section MEM. The noise image data $I_2$ is data of noise signals for all the pixels, the noise signals having been generated on the basis of the charge accumulated in the charge holding section DM.

The DSP circuit 210 performs predetermined noise reduction processing on the basis of the image data $I_1$ and the noise image data $I_2$ inputted from the solid-state imaging device 1 (step S104). The DSP circuit 210 performs the above-described noise reduction processing using correction coefficients α stored in the storage section 240. The DSP circuit 210 causes the frame memory 220 to hold image data $I_c$ obtained by the noise reduction processing, and the frame memory 220 causes the storage section 240 to store the image data $I_c$ (step S108). In such a manner, imaging is performed by the electronic apparatus 2.

FIGS. 13 and 14 each illustrate an example of the correction coefficient for each pixel used in the above-described noise reduction processing.

For example, as illustrated in FIG. 13, in a case where the two or more sensor pixels 11 include two or more sensor pixels 11R for red light, two or more sensor pixels 11G for green light, and two or more sensor pixels 11B for blue light, a correction coefficient α for red light may be provided for each of the colors of the sensor pixels 11. It is to be noted that FIG. 13 illustrates, as an example, a case where a correction coefficient $α_R$ is set for the sensor pixels 11R for red light, a correction coefficient $α_G$ is set for the sensor pixels 11G for green light, and a correction coefficient $α_B$ is set for the sensor pixels 11B for blue light. Further, FIG. 13 schematically illustrates a state in which one color sensor pixel is constituted by one sensor pixel 11R, two sensor pixels 11G, and one sensor pixel 11B. The correction coefficient $α_R$, the correction coefficient $α_G$, and the correction coefficient $α_B$ are, for example, values corresponding to the wavelengths, and are values different from each other.

Further, for example, as illustrated in FIG. 14, the correction coefficients α may be provided in correspondence with positions in the pixel array section 10. It is to be noted that FIG. 14 illustrates, as an example, a case where a correction coefficient $α_a$ is set for a center portion of the pixel array section 10, a correction coefficient $α_b$ is set for an upper center portion of the pixel array section 10, a correction coefficient $\alpha_c$ is set for a lower center portion of the pixel array section 10, a correction coefficient $\alpha_d$ is set for a left center of the pixel array section 10, a correction coefficient $\alpha_e$ is set for an upper left portion of the pixel array section 10, a correction coefficient $\alpha_{df}$ is set for a lower left portion of the pixel array section 10, a correction coefficient $\alpha_g$ is set for a right center of the pixel array section 10, a correction coefficient $\alpha_h$ is set for an upper right portion of the pixel array section 10, and a correction coefficient $\alpha_h$ is set for a lower right portion of the pixel array section 10. The correction coefficient $\alpha_i$, the correction coefficient $\alpha_b$, the correction coefficient $\alpha_c$, the correction coefficient $\alpha_d$, the correction coefficient $\alpha_e$, the correction coefficient $\alpha_f$, the correction coefficient $\alpha_g$, the correction coefficient $\alpha_h$, and the correction coefficient $\alpha_i$ are, for example, values corresponding to the positions in the pixel array section 10, and are values different from each other.

The DSP circuit 210 performs the predetermined noise reduction processing on the basis of the image data $I_1$ and the noise image data $I_2$ inputted from the solid-state imaging device 1 and thereby obtains the image data $I_c$ with reduced PLS noise. The DSP circuit 210 reduces noise contained in the image data $I_1$ by, for example, subtracting, from the image data $I_1$, image data ($\alpha I_2$) obtained by multiplying the noise image data $I_2$ by the predetermined correction coefficient $\alpha$. For example, the DSP circuit 210 obtains the image data $I_c$ in accordance with the following equation (1).

$$I_c = I_1 - \alpha I_2 \tag{1}$$

In the electronic apparatus 2, the solid-state imaging device 1 according to any of the foregoing embodiment and modification examples thereof is used and the noise reduction processing described above is performed at the DSP circuit 210. This makes it possible to accurately eliminate the influence of obliquely incident light leaking into the charge accumulation section while suppressing a decrease in resolution and a reduction in conversion efficiency.

4. Example of Practical Application

The technology according to the present disclosure (the present technology) is applicable to various products. For example, the technology according to the present disclosure may be implemented as a device to be mounted on any type of mobile body such as an automobile, an electric vehicle, a hybrid electric vehicle, a motorcycle, a bicycle, a personal mobility, an airplane, a drone, a vessel, or a robot.

FIG. 15 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 15, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 30, an audio speaker 12061, a display section 12062, and an instrument panel 12063 are illustrated as the output device. The display section 12062 may, for example, include at least one of an on-board display and a head-up display.

FIG. 16 is a diagram depicting an example of the installation position of the imaging section 12031.

In FIG. 16, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 16 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Examples of the mobile body control system to which the technology according to the present disclosure is applicable have been described above. The technology according to the present disclosure is applicable to the imaging section 12031 of the configuration described above. Specifically, the solid-state imaging device 1 according to any of the foregoing embodiment and modification examples thereof is applicable to the imaging section 12031. Applying the technology according to the present disclosure to the imaging section 12031 makes it possible to obtain a high-definition captured image with less noise. It is thus possible to carry out a highly accurate control using the captured image in the mobile body control system.

The present disclosure has been described above with reference to the embodiment, and the modification examples, the application examples, and the examples of practical application thereof. The present disclosure is, however, not limited to the embodiment and the like described above, and a variety of modifications may be made. It should be noted that the effects described herein are mere examples. The effects of the present disclosure are not limited to the effects described herein. The present disclosure may have any effect other than the effects described herein.

Moreover, the present disclosure may also have the following configurations.

(1)
A solid-state imaging device including:
a light receiving surface; and
two or more pixels opposed to the light receiving surface, in which
each of the pixels includes
a photoelectric conversion section that performs photoelectric conversion on light entering via the light receiving surface,
a first charge holding section that holds a charge transferred from the photoelectric conversion section,
a second charge holding section disposed at a position where all or a portion of the second charge holding section overlaps the first charge holding section in a planar layout, and formed to have no electrical continuity to the first charge holding section,
a first transfer transistor that transfers the charge held by the first charge holding section to a floating diffusion, and
a second transfer transistor that transfers a charge held by the second charge holding section to the floating diffusion.

(2)
The solid-state imaging device according to (1), in which
the first charge holding section, the second charge holding section, and the floating diffusion all include impurity semiconductor regions of a common electrical conductivity type, and
the first charge holding section and the second charge holding section each have an impurity concentration lower than an impurity concentration of the floating diffusion.

(3)
The solid-state imaging device according to (2), in which the second transfer transistor includes a vertical gate reaching the second charge holding section.

(4)
The solid-state imaging device according to (2), in which the second transfer transistor is electrically coupled to the second charge holding section by an impurity semiconductor region reaching the second charge holding section and having an impurity concentration higher than the impurity concentration of the second charge holding section.

(5)
The solid-state imaging device according to any one of (1) to (4), in which
each of the pixels further includes a third transfer transistor that transfers a charge accumulated in the photoelectric conversion section to the first charge holding section,
the photoelectric conversion section is disposed at a position adjacent to the first charge holding section and the second charge holding section in the planar layout, and
the light receiving surface is formed at a position on a side of the third transfer transistor in terms of positional relationship with the photoelectric conversion section.

(6)
The solid-state imaging device according to (5), in which each of the pixels includes a light blocking layer disposed at a position around the light receiving surface and opposed to at least the first charge holding section.

(7)
The solid-state imaging device according to any one of (1) to (4), in which
each of the pixels further includes a third transfer transistor that transfers a charge accumulated in the photoelectric conversion section to the first charge holding section,
the photoelectric conversion section is disposed at a position where a portion of the photoelectric conversion section overlaps the first charge holding section and the second charge holding section in the planar layout and
the light receiving surface is formed at a position on an opposite side from the third transfer transistor in terms of positional relationship with the photoelectric conversion section.

(8)
The solid-state imaging device according to (7), in which each of the pixels includes a light blocking layer between the photoelectric conversion section and the second charge holding section.

(9)
An electronic apparatus including:
a solid-state imaging device that outputs image data corresponding to entering light; and
a signal processing circuit that processes the image data, the solid-state imaging device including
a light receiving surface; and
two or more pixels opposed to the light receiving surface, in which
each of the pixels includes
a photoelectric conversion section that performs photoelectric conversion on light entering via the light receiving surface,
a first charge holding section that holds a charge transferred from the photoelectric conversion section,
a second charge holding section disposed at a position where all or a portion of the second charge holding section overlaps the first charge holding section in a planar layout, and formed to have no electrical continuity to the first charge holding section,
a first transfer transistor that transfers the charge held by the first charge holding section to a floating diffusion, and
a second transfer transistor that transfers a charge held by the second charge holding section to the floating diffusion, and the signal processing circuit reduces noise contained in first image data on a basis of the first image data and second image data, the first image data being generated on a basis of the charge held by the first charge holding section, the second image data being generated on a basis of the charge held by the second charge holding section.

(10)

The electronic apparatus according to (9), in which the signal processing circuit reduces the noise contained in the first image data by subtracting third image data from the first image data, the third image data being obtained by multiplying the second image data by a predetermined correction coefficient.

According to the solid-state imaging device and the electronic apparatus of the respective embodiments of the present disclosure, provided are the first charge holding section that holds the charge transferred from the photoelectric conversion section, and the second charge holding section formed to have no electrical continuity to the first charge holding section. All or a portion of the second charge holding section is disposed at a position overlapping the first charge holding section in a planar layout. The first transfer transistor is used in reading the charge from the first charge holding section, and the second transfer transistor is used in reading the charge from the second charge holding section. Accordingly, it is possible to accurately eliminate the influence of obliquely incident light leaking into the charge accumulation section while suppressing a decrease in resolution and a reduction in conversion efficiency.

The present application claims priority based on Japanese Patent Application No. 2018-175983 filed with the Japan Patent Office on Sep. 20, 2018, the entire content of which is incorporated herein by reference.

It should be understood that those skilled in the art would make various modifications, combinations, sub-combinations, and alterations depending on design requirements and other factors, and they are within the scope of the attached claims or the equivalents thereof.

The invention claimed is:

1. A solid-state imaging device comprising:
   a light receiving surface; and
   two or more pixels opposed to the light receiving surface, wherein
   each of the pixels includes
   a photoelectric conversion section that performs photoelectric conversion on light entering via the light receiving surface,
   a first charge holding section that holds a charge transferred from the photoelectric conversion section,
   a second charge holding section disposed at a position where all or a portion of the second charge holding section overlaps the first charge holding section in a planar layout, and formed to have no electrical continuity to the first charge holding section,
   a first transfer transistor that transfers the charge held by the first charge holding section to a floating diffusion, and
   a second transfer transistor that transfers a charge held by the second charge holding section to the floating diffusion, wherein
   the first charge holding section, the second charge holding section, and the floating diffusion all include impurity semiconductor regions of a common electrical conductivity type,
   the first charge holding section and the second charge holding section each have an impurity concentration lower than an impurity concentration of the floating diffusion, and
   the second transfer transistor is electrically coupled to the second charge holding section by an impurity semiconductor region reaching the second charge holding section and having an impurity concentration higher than the impurity concentration of the second charge holding section.

2. The solid-state imaging device according to claim 1, wherein
   each of the pixels further includes a third transfer transistor that transfers a charge accumulated in the photoelectric conversion section to the first charge holding section,
   the photoelectric conversion section is disposed at a position adjacent to the first charge holding section and the second charge holding section in the planar layout, and
   the light receiving surface is formed at a position on a side of the third transfer transistor in terms of positional relationship with the photoelectric conversion section.

3. The solid-state imaging device according to claim 2, wherein each of the pixels includes a light blocking layer disposed at a position around the light receiving surface and opposed to at least the first charge holding section.

4. The solid-state imaging device according to claim 1, wherein
   each of the pixels further includes a third transfer transistor that transfers a charge accumulated in the photoelectric conversion section to the first charge holding section,
   the photoelectric conversion section is disposed at a position where a portion of the photoelectric conversion section overlaps the first charge holding section and the second charge holding section in the planar layout, and
   the light receiving surface is formed at a position on an opposite side from the third transfer transistor in terms of positional relationship with the photoelectric conversion section.

5. The solid-state imaging device according to claim 4, wherein each of the pixels includes a light blocking layer between the photoelectric conversion section and the second charge holding section.

6. An electronic apparatus comprising the solid-state imaging device according to claim 1.

7. The electronic apparatus according to claim 6, wherein
   the first charge holding section, the second charge holding section, and the floating diffusion all include impurity semiconductor regions of a common electrical conductivity type, and
   the first charge holding section and the second charge holding section each have an impurity concentration lower than an impurity concentration of the floating diffusion.

8. The electronic apparatus according to claim 6, wherein
   each of the pixels further includes a third transfer transistor that transfers a charge accumulated in the photoelectric conversion section to the first charge holding section,
   the photoelectric conversion section is disposed at a position adjacent to the first charge holding section and the second charge holding section in the planar layout, and the light receiving surface is formed at a position on a side of the third transfer transistor in terms of positional relationship with the photoelectric conversion section.

9. The electronic apparatus according to claim 8, wherein each of the pixels includes a light blocking layer disposed at a position around the light receiving surface and opposed to at least the first charge holding section.

10. The electronic apparatus according to claim 6, wherein each of the pixels further includes a third transfer transistor that transfers a charge accumulated in the photoelectric conversion section to the first charge holding section, the photoelectric conversion section is disposed at a position where a portion of the photoelectric conversion section overlaps the first charge holding section and the second charge holding section in the planar layout, and the light receiving surface is formed at a position on an opposite side from the third transfer transistor in terms of positional relationship with the photoelectric conversion section.

11. The electronic apparatus according to claim 10, wherein each of the pixels includes a light blocking layer between the photoelectric conversion section and the second charge holding section.

12. The solid-state imaging device according to claim 1, wherein the first charge holding section, the second charge holding section, and the floating diffusion all include impurity semiconductor regions of a common electrical conductivity type, and the first charge holding section and the second charge holding section each have an impurity concentration lower than an impurity concentration of the floating diffusion.

* * * * *